United States Patent [19]
Fuentes et al.

[11] Patent Number: 5,457,431
[45] Date of Patent: Oct. 10, 1995

[54] ELECTRONIC TUNING CIRCUIT AND METHOD OF MANUFACTURE

[75] Inventors: Carlos Fuentes, Sunnyvale; Edmond H. Chan, San Francisco, both of Calif.

[73] Assignee: Harris Corporation, Melbourne, Fla.

[21] Appl. No.: 207,172

[22] Filed: Mar. 8, 1994

[51] Int. Cl.⁶ ................... H01P 7/10; H03B 5/18
[52] U.S. Cl. ............... 331/107 DP; 331/107 SL; 331/ 117 D; 333/235
[58] Field of Search ............... 333/235, 205; 331/107 DP, 107 SL, 117 D

[56] References Cited

U.S. PATENT DOCUMENTS

| | | |
|---|---|---|
| 4,034,313 | 7/1977 | Jones et al. . |
| 4,445,097 | 4/1984 | Godart et al. . |
| 4,580,116 | 4/1986 | Ballato . |
| 4,588,964 | 5/1986 | Hirai et al. . |
| 4,733,198 | 3/1988 | Blickstein et al. . |
| 4,835,498 | 5/1989 | Rouger et al. . |
| 4,871,983 | 10/1989 | Graycar . |
| 4,926,142 | 5/1990 | Mettoudi . |
| 4,999,587 | 3/1991 | Evans . |

FOREIGN PATENT DOCUMENTS

| | | | |
|---|---|---|---|
| 30309 | 2/1984 | Japan | 331/117 D |
| 54704 | 3/1986 | Japan | 331/117 D |
| 5029835 | 2/1993 | Japan | 331/107 DP |
| 4764 | 3/1992 | WIPO | 331/117 D |

*Primary Examiner*—Benny Lee
*Attorney, Agent, or Firm*—Rogers & Killeen

[57] ABSTRACT

A method of manufacturing a varactor circuit and a varactor circuit for tuning a dielectric resonator oscillator (DRO). The circuit pattern for the varactor circuit includes a minimum circuit pattern that is common to several circuit patterns for the varactor circuit that compensate for non-linearities in a connected non-linear varactor and provide the desired characteristics for the DRO. Other portions of the several circuit patterns are provided in isolated elements, each of which has a size and shape so that it does not resonate within the DRO's operating frequencies. The isolated elements are selectively connected to the minimum circuit pattern to form a suitable circuit pattern.

19 Claims, 2 Drawing Sheets

ELECTRONIC TUNING CIRCUIT AND METHOD OF MANUFACTURE

BACKGROUND OF THE INVENTION

The present invention relates to tuning circuits, and more particularly to an improved varactor circuit and method of making a varactor circuit for tuning a dielectric resonator oscillator (DRO) that facilitates production of DROs and that compensates for non-linearities in the varactor.

Digital microwave radios, and other high frequency communication and/or data processing devices, may include devices with electronically tuned frequency sources. Such frequency tuning sources may include a dielectric resonator and a varactor circuit to form a stable and adjustable frequency source. With reference to FIG. 1, a tuning source 10 of the prior art may include a transmission line 12 connected to an oscillator (not shown) and a varactor circuit 14 coupled to the line 12 through a dielectric resonator 16. The transmission line 12 carries signals that control oscillator frequency. The varactor circuit 14 is separated from the line 12 and includes a varactor 18 (a capacitor that varies according to the voltage applied to its terminals) at one end and an open circuit at an opposing end. The varactor circuit 14 may be on or in a substrate 20 that may also carry the transmission line 12 and the resonator 16.

When the source 10 is operating, the resonator 16 is electromagnetically coupled to the line 12 (shown by magnetic flux line 22) and to the varactor circuit 14 (shown by magnetic flux line 24) so that a change of voltage in the varactor 18 causes a change in the signals carried by the line 12. Thus, the frequency of the oscillator may be changed by changing the voltage provided to the varactor 18. The source 10 functions like a filter in that signals in the line 12 have their characteristics (e.g., frequency band) modified by the effect of the magnetic field of the resonator 16 on the magnetic field of the line 12.

The frequency band and speed of the source 10 are influenced by the physical characteristics and arrangement of the line 12, the resonator 16 and the varactor circuit 14. That is, the size and shape of the circuit 14, the size and shape of the resonator 16, and the distance of the resonator 16 from the line 12 and from the circuit 14 may be selected to provide the source 10 with predetermined characteristics. See, for example, the linear and arcuate varactor circuit patterns illustrated in U.S. Pat. No. 4,835,498 issued May 30, 1989 to Rouger, et al. Numerous arrangements of resonator, varactor circuit and transmission line provide a wide variety of tuning characteristics.

In some applications, such as in a phase lock source (PLS), the electronic tuning is desirably linear. That is, there is a linear relationship between the voltage applied to the varactor and the resulting frequency band. However, a non-linear varactor is typically favored for use in a low noise, narrowband frequency tuning DRO. The non-linear varactor introduces an undesirable, non-linear frequency versus varactor voltage relationship. The pattern of the varactor circuit (e.g., size and shape) may be selected to compensate for this non-linearity, and various techniques for determining the appropriate pattern are known and need not be considered in detail herein. The techniques are typically empirical, rather than analytical and thus the results are more likely achieved through trial and error than prediction.

Nevertheless, when the numerous arrangements of resonator, varactor circuit and transmission line are considered with the various, unpredictable patterns that may be used to compensate for a non-linear varactor, it is apparent that the manufacture of these devices can be expensive because of the plethora of combinations available. A different substrate could be required for each varactor circuit pattern if one pattern were printed on a substrate. The manufacture of separate substrates with different varactor circuit patterns increases unit cost and time of manufacture. To lower cost and to facilitate manufacture of the devices, the number of manufacturing configurations is desirably reduced. Specifically, it is desirable to reduce the number of substrates with different varactor circuit patterns that have to be formed for the desired values of operating characteristics.

In the present invention, one substrate may be used that includes all of the determined varactor circuit patterns, thereby facilitating manufacture of varactor circuits and the devices in which they operate. The determined varactor circuit patterns are divided into elements, some of which are common to all the determined patterns, and others of which are small enough so they do not resonate or otherwise affect the characteristics of the signal in the transmission line. The common pattern is thereafter selectively connected to small elements to form a particular pattern to compensate for the non-linear varactor, and to provide the desired device characteristics.

Accordingly, it is an object of the present invention to provide a novel tuning circuit and method of tuning that obviates the problems of the prior art and facilitates the production of the tuning circuit.

It is a further object of the present invention to provide a novel tuning circuit and method of tuning in which tuning circuit patterns for each predetermined value of an operating characteristic are provided in separate circuit elements that may be selectively connected to form a particular tuning circuit.

It is yet a further object of the present invention to provide a novel tuning circuit and method of tuning in which tuning circuit patterns include separate circuit elements that do not affect tuning when not selectively connected.

It is still a further object of the present invention to provide a novel tuning circuit and method of tuning in which plural tuning circuit elements may be selectively connected to change the width and/or length of the tuning circuit.

It is another object of the present invention to provide a novel tuning circuit and method of tuning in which concentric tuning circuit elements and/or linear tuning circuit elements may be selectively connected to change the tuning frequency of the circuit.

It is yet another object of the present invention to provide a novel method of compensating for a non-linear varactor in a tuning circuit in which separate circuit elements are selectively connected to provide an appropriately shaped varactor circuit.

These and many other objects and advantages of the present invention will be readily apparent to one skilled in the art to which the invention pertains from a perusal of the claims, the appended drawings, and the following detailed description of preferred embodiments.

DESCRIPTION OF PREFERRED EMBODIMENTS

Figure 1:
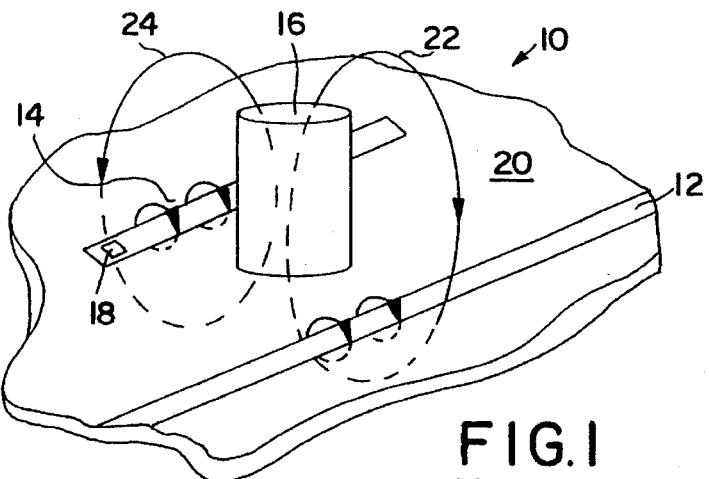
FIG. 1 is a pictorial representation of a tunable microwave filtering device of the prior art illustrating magnetic coupling of the transmission line, dielectric resonator and varactor circuit.
Figure 2:
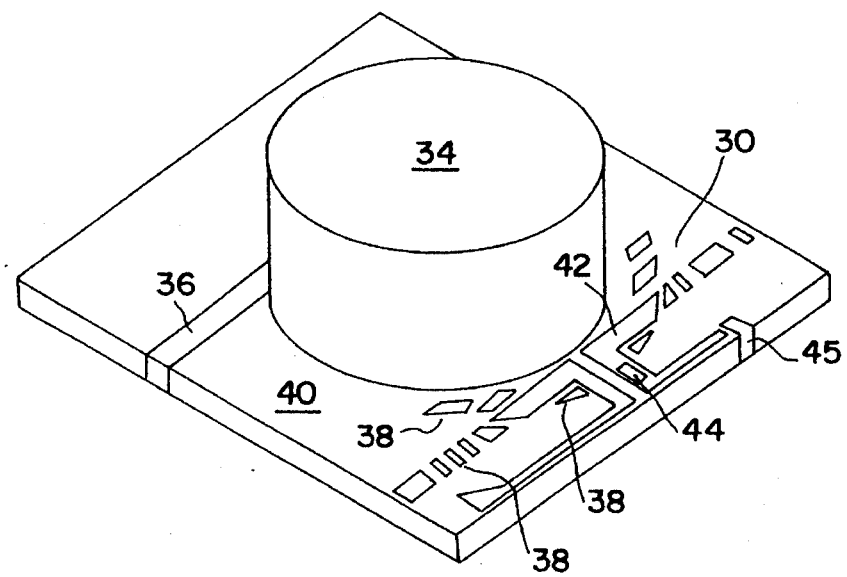
FIG. 2 is a pictorial depiction of an embodiment of the present invention.

With reference now to FIG. 2, an embodiment of the present invention may include a varactor circuit 30 for tuning a dielectric resonator oscillator (DRO) (not shown), the varactor circuit 30 being magnetically coupled to a dielectric resonator 34 that is magnetically coupled to a transmission line 36 when the DRO is operating. The frequency bands to be carried by the transmission line 36 may be in part determined by the pattern of the varactor circuit 30 and by the size of the dielectric resonator 34 and the position of the dielectric resonator 34 relative to the transmission line 36 and to the varactor circuit 30.

The varactor circuit 30 may include separate circuit elements 38 on a substrate 40 (for example, a thin film substrate), each of the elements 38 being a portion of a varactor circuit pattern for at least one of the frequency bands that may be carried by the transmission line 36. At least one of the circuit elements 38 may be a minimum circuit pattern 42 that is common to each of the varactor circuit patterns. The minimum pattern 42 illustrated in FIG. 2 is divided in two, with the two parts being electrically connected as discussed below. The remaining circuit elements 38 (those not part of the minimum circuit pattern 42) each has a size and shape so that they do not resonate within the frequency bands that are to be carried by the transmission line 36. For example, any dimension of an element 38 desirably would not exceed about one-eighth of the guided wavelength. A varactor 44 may be electrically connected to the minimum circuit pattern 42 so that at least one end of the pattern 42 is an open circuit.

The varactor 44 may be located on either part of the minimum pattern 42, depending on the polarity of the varactor tuning voltage that biases the varactor. For example, the varactor may be located on one part when the bias is positive and located on the other part when the bias is negative. The pattern 42 may be grounded with a ground ribbon 45 (for example, a gold ribbon) that provides a return path for the direct current supplied by the source of varactor tuning voltage (not shown).

The varactor may be a "mesa" type that has a cathode on the bottom of the varactor and an anode wire bonding pad on the top. The varactor may be attached at its cathode using conventional methods, such as soldering, and may be attached to the other part of the pattern 42 from its anode using conventional methods, such as a wire connection.

Figure 4:
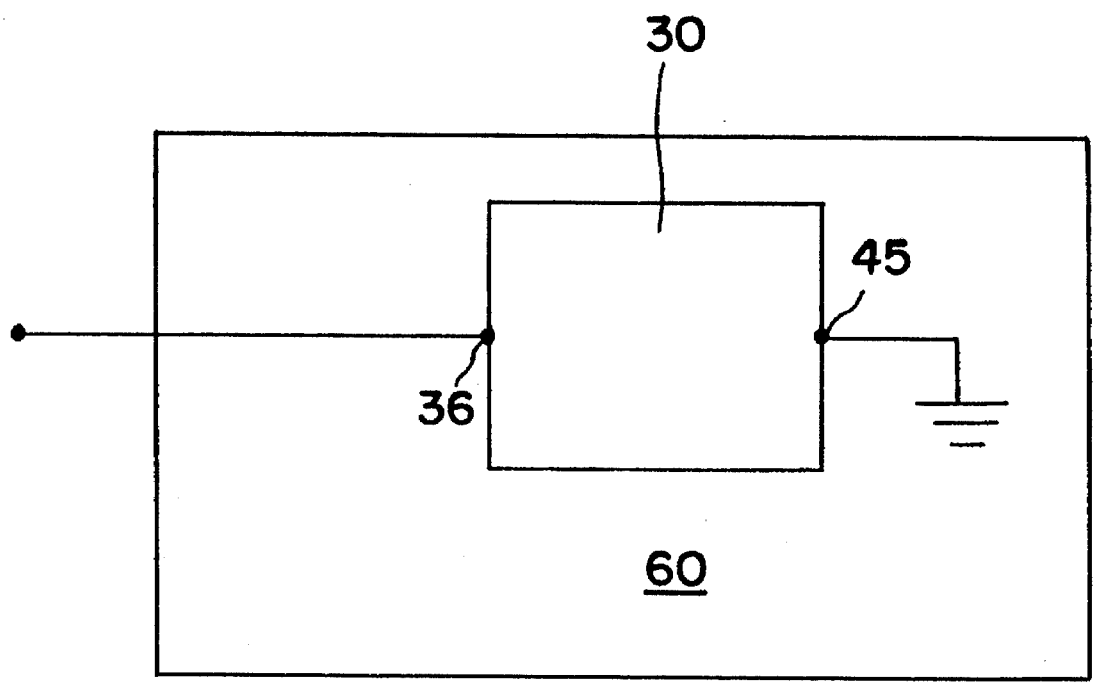
FIG. 4 is a block diagram of a digital microwave radio including a varactor circuit embodiment of the present invention.

The minimum pattern 42 is preferably arcuate and the circuit elements 38 may be arranged and connected to create further arcuate parts of the varactor circuit, or to create linear parts, or to widen or lengthen a circuit part, such as may be needed to compensate for non-linearities in the varactor 44. The varactor circuit of the present invention may vary from those shown in the figures and the invention is not to be limited to the depicted patterns. Furthermore, the varactor circuit 30 of the present invention may be incorporated in a digital microwave radio 60, as shown in FIG. 4. As in the previously described embodiments, the varactor circuit 30 may be connected to a transmission line 36 and a ground ribbon 45 in the digital microwave radio 60.

Figure 3:
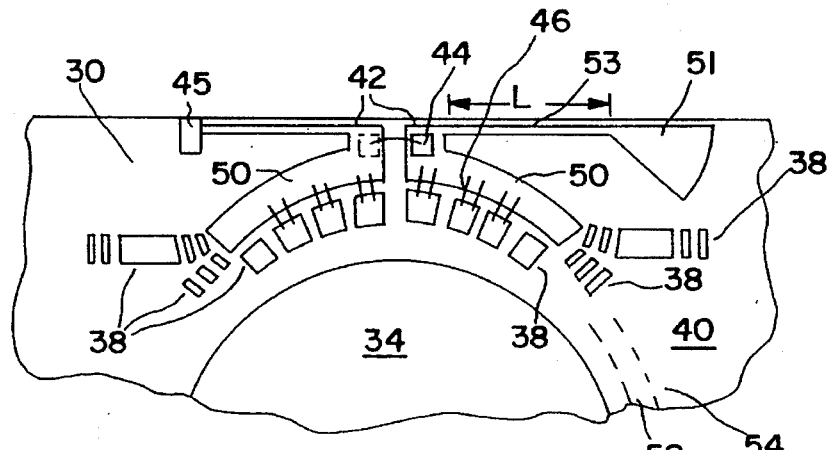
FIG. 3 is an overhead plan view of a further embodiment of the present invention.

As may be more clearly seen in FIG. 3, in which like numerals refer to like parts of FIG. 2, selected circuit elements 38 may be electrically connected to the minimum circuit pattern 42 with conventional connectors, such as wire 46. In a preferred embodiment, the minimum circuit pattern 42 may include two or more arcuate sections 50 that are electrically connected to the varactor between adjacent ends. The circuit elements 38 may be positioned at the remote ends of the arcuate sections, and/or positioned adjacent and concentric to the arcuate sections 50 to provide numerous options to change the size and shape of the varactor circuit 30. The circuit elements 38 may be of any shape and size and need not be the same, so long as they are small enough to avoid interference in device operation when they are not connected to the minimum circuit pattern 42.

The varactor 44 is illustrated in a positive bias location in FIG. 3 (the negative bias location for the varactor is shown in dashed lines in the opposing part of the pattern 42). The varactor tuning voltage (the bias) may be applied at the apex of the radial stub 51. The radial stub 51 is a virtual radio frequency ground over a predetermined frequency bandwidth that provides an RF short circuit at its apex. The high impedance line 53 may have a length L that is one-quarter the wavelength of the guided frequency.

The varactor circuit 30 may be provided in the substrate 40, on the substrate surface on which the resonator 34 is located, or on the opposing surface. The circuit 30 may be applied using conventional techniques, such as printing or etching. The patterns for the varactor circuit 30 may be determined using known techniques that are not part of the present invention.

The resonator 34 may be positioned over or adjacent the varactor circuit 30 and transmission line 36 (see FIG. 2), as appropriate for the device's characteristics. Two of the placement options are depicted in FIG. 3 by the portions of the periphery of the resonator shown by dashed lines 52 and 54.

For example, and with further reference to FIG. 3, a low band DRO may use a large dielectric resonator (e.g., a resonator extending to line 54) and connect the pattern 42 to all of the circuit elements 38 that extend from the end of the arcuate sections 50 to form a quarter-wave resonator. For a high band DRO, a small dielectric resonator (e.g., the resonator 34) may be used, and the concentric circuit elements 38 may be connected as shown in FIG. 3. For a mid-band DRO, a mid-size resonator (e.g., a resonator extending to line 52) may be used, and only those circuit elements 38 adjacent the end of the arcuate sections 50 may be connected to the pattern 42.

While preferred embodiments of the present invention have been described, it is to be understood that the embodiments described are illustrative only and the scope of the invention is to be defined solely by the appended claims when accorded a full range of equivalence, many variations and modifications naturally occurring to those skilled in the art from a perusal hereof.

What is claimed is:

1. A tuning circuit for an oscillator, a pattern of the tuning circuit in part determining a value of an operating characteristic of the oscillator, said tuning circuit comprising:

a minimum tuning circuit pattern, said minimum pattern being a pattern common to the tuning circuit patterns for predetermined values of the operating characteristic of the oscillator;

plural circuit elements adjacent said minimum pattern, said plural circuit elements being parts of the tuning circuit patterns for said predetermined values of the operating characteristic that are separate from each other and from said minimum pattern, each of said plural circuit elements having a size and shape so that it does not affect the operating characteristic within the range of predetermined values thereof when not connected to the minimum pattern; and selected ones of said plural circuit elements being electrically connected to said minimum pattern to thereby form said tuning circuit, wherein said minimum pattern comprises two sections that are electrically connected at first ends, and wherein said varactor is attached to one of said two sections.

2. The circuit of claim 1 wherein said two sections are arcuate and adjacent at said first ends, and wherein said plural circuit elements comprise linear elements that are adjacent second ends of said two sections and arcuate elements that are concentric to said two arcuate sections.

3. A method of manufacturing a varactor circuit for tuning a dielectric resonator oscillator (DRO), the varactor circuit being magnetically coupled to a dielectric resonator that is magnetically coupled to a transmission line when the DRO is operating, the frequency bands to be carried by the transmission line being in part determined by the pattern of the varactor circuit and by the size of the dielectric resonator and the position of the dielectric resonator relative to the transmission line and to the varactor circuit, the method comprising the steps of:

(a) determining circuit patterns for the varactor circuit for plural of the frequency bands that may be carried by the transmission line;

(b) determining a minimum circuit pattern that is common to all of the determined circuit patterns;

(c) forming the portions of the determined circuit patterns that are not part of the minimum circuit pattern into isolated elements, each of the isolated elements having a size and shape so that it does not resonate within the frequency bands that may be carried by the transmission line;

(d) forming the minimum circuit pattern and each of the isolated elements on the substrate; and (e) selectively connecting the isolated elements to the minimum circuit pattern to thereby form one of the determined circuit patterns, wherein the step of forming the minimum circuit pattern comprises the step of forming a portion of the minimum circuit pattern in an arcuate pattern.

4. The method of claim 3 wherein the step of forming the isolated elements comprises the step of forming the isolated elements in linear patterns that extend from the ends of the arcuate pattern.

5. The method of claim 4 wherein the step of selectively connecting the elements comprises the step of connecting the linear patterns to the arcuate pattern to thereby increase the length of the varactor circuit.

6. The method of claim 3 wherein the step of forming the isolated elements comprises the step of forming the isolated elements in a second arcuate pattern concentric to the arcuate pattern.

7. The method of claim 6 wherein the step of selectively connecting the elements comprises the step of connecting the second arcuate pattern to the arcuate pattern to thereby increase the width of the varactor circuit.

8. The method of claim 3 further comprising the step of providing a virtual radio frequency ground for the minimum circuit pattern.

9. The method of claim 8 wherein the radio frequency ground is provided with a radial portion and wherein a bias voltage for the varactor circuit is applied to an apex of the radial portion.

10. A method of manufacturing a tuning circuit for an oscillator in which a pattern of the tuning circuit in part determines a value of an operating characteristic of the oscillator, the method comprising the steps of:

(a) forming a minimum tuning circuit pattern, the minimum pattern being a pattern common to tuning circuit patterns for predetermined values of the operating characteristic of the oscillator;

(b) forming plural circuit elements adjacent the minimum pattern, the plural circuit elements being parts of the tuning circuit patterns for the predetermined values of the operating characteristic that are separate from each other and from the minimum pattern, each of the plural circuit elements having a size and shape so that it does not affect the operating characteristic within the range of predetermined values thereof when not connected to the minimum pattern; and (c) connecting selected ones of the plural circuit elements to the minimum pattern to thereby form one of the tuning circuit patterns, wherein the minimum pattern is formed in two parts that are electrically connected, and further comprising the step of attaching a varactor to one of the two parts.

11. A tuning circuit for an oscillator, a pattern of the tuning circuit in part determining a value of an operating characteristic of the oscillator, said tuning circuit comprising:

a minimum tuning circuit pattern, said minimum pattern being a pattern common to the tuning circuit patterns for predetermined values of the operating characteristic of the oscillator;

plural circuit elements adjacent said minimum pattern, said plural circuit elements being parts of the tuning circuit patterns for said predetermined values of the operating characteristic that are separate from each other and from said minimum pattern, each of said plural circuit elements having a size and shape so that it does not affect the operating characteristic within the range of predetermined values thereof when not connected to the minimum pattern; and selected ones of said plural circuit elements being electrically connected to said minimum pattern to thereby form said tuning circuit, wherein said minimum pattern has an arcuate portion between opposing ends and said plural circuit elements are adjacent said opposing ends and concentric to said arcuate portion.

12. The circuit of claim 11 wherein said plural circuit elements are not all the same size and shape.

13. A method of manufacturing a tuning circuit for an oscillator in which a pattern of the tuning circuit in part determines a value of an operating characteristic of the oscillator, the method comprising the steps of:

(a) forming a minimum tuning circuit pattern, the minimum pattern being a pattern common to tuning circuit patterns for predetermined values of the operating characteristic of the oscillator;

(b) forming plural circuit elements adjacent the minimum pattern, the plural circuit elements being parts of the tuning circuit patterns for the predetermined values of the operating characteristic that are separate from each other and from the minimum pattern, each of the plural circuit elements having a size and shape so that it does not affect the operating characteristic within the range of predetermined values thereof when not connected to the minimum pattern; and (c) connecting selected ones of the plural circuit elements to the minimum pattern to thereby form one of the tuning circuit patterns, wherein the minimum pattern has opposing ends and the circuit elements are formed adjacent each of the opposing ends.

14. The method of claim 13 wherein the minimum pattern has an arcuate portion between the opposing ends and the circuit elements are formed adjacent each of the opposing ends and adjacent the arcuate portion.

15. A varactor circuit for tuning a dielectric resonator oscillator (DRO), the varactor circuit being magnetically coupled to a dielectric resonator that is magnetically coupled to a transmission line when the DRO is operating, the frequency bands to be carried by the transmission line being in part determined by the pattern of the varactor circuit and by the size of the dielectric resonator and the position of the dielectric resonator relative to the transmission line and to the varactor circuit, the varactor circuit comprising:

a plurality of separate circuit elements on a substrate, each of said elements being a portion of a varactor circuit pattern for at least one of the frequency bands that may be carried by the transmission line;

at least one of said circuit elements being a minimum circuit pattern that is common to each said varactor circuit pattern;

ones of said circuit elements not part of said minimum circuit pattern each having a size and shape so that they do not resonate within the frequency bands that are to be carried by the transmission line;

selected ones of said circuit elements not part of said minimum circuit pattern being electrically connected to said minimum circuit pattern to thereby form said varactor circuit; and a varactor connected to said minimum circuit pattern, wherein said minimum circuit pattern comprises an arcuate portion.

16. The circuit of claim 15 wherein said selected circuit elements not part of said minimum circuit pattern extend from ends of said arcuate portion.

17. The circuit of claim 15 wherein said selected circuit elements not part of said minimum circuit pattern are concentric to said arcuate portion.

18. The circuit of claim 15 wherein said minimum circuit pattern has plural parts, and wherein said varactor is attached to one of said plural parts when a bias voltage for the varactor circuit has a predetermined polarity and is attached to another one of said plural parts when the bias voltage has another polarity.

19. The circuit of claim 15 further comprising a fan-shaped virtual radio frequency ground connected to said minimum circuit pattern.

* * * * *